United States Patent
Luan

(10) Patent No.: US 9,365,415 B2
(45) Date of Patent: Jun. 14, 2016

(54) COMPACT ELECTRONIC PACKAGE WITH MEMS IC AND RELATED METHODS

(71) Applicant: STMICROELECTRONICS (SHENZHEN) R&D CO., LTD., Nanshan, Shezhen (CN)

(72) Inventor: Jing-En Luan, Shenzhen (CN)

(73) Assignee: STMICROELECTRONICS (SHENZHEN) R&D CO. LTD, Shenzhen (CN)

(*) Notice: Subject to any disclaimer, the term of this patent is extended or adjusted under 35 U.S.C. 154(b) by 0 days.

(21) Appl. No.: 14/587,324

(22) Filed: Dec. 31, 2014

(65) Prior Publication Data

US 2015/0183637 A1    Jul. 2, 2015

(30) Foreign Application Priority Data

Jan. 2, 2014 (CN) .......................... 2014 1 0007142

(51) Int. Cl.
*B81B 7/00* (2006.01)
*B81C 1/00* (2006.01)

(52) U.S. Cl.
CPC ............... *B81C 1/0023* (2013.01); *B81B 7/007* (2013.01)

(58) Field of Classification Search
CPC .............................. B81C 1/0023; B81B 7/007
See application file for complete search history.

(56) References Cited

U.S. PATENT DOCUMENTS

| | | | |
|---|---|---|---|
| 6,661,084 B1 | 12/2003 | Peterson | |
| 6,674,159 B1 | 1/2004 | Peterson | |
| 7,372,141 B2 | 5/2008 | Karnezos | |
| 7,394,148 B2 | 7/2008 | Karnezos | |
| 7,429,786 B2 | 9/2008 | Karnezos | |
| 7,429,787 B2 | 9/2008 | Karnezos | |
| 7,645,634 B2 | 1/2010 | Karnezos | |
| 7,687,899 B1* | 3/2010 | Berry | H01L 21/561 257/687 |
| 8,049,326 B2 | 11/2011 | Najafi | |
| 2004/0065963 A1* | 4/2004 | Karnezos | H01L 23/3128 257/777 |
| 2005/0212078 A1 | 9/2005 | Kwon | |
| 2006/0220209 A1 | 10/2006 | Karnezos | |
| 2006/0220210 A1 | 10/2006 | Karnezos | |
| 2006/0244117 A1 | 11/2006 | Karnezos | |

(Continued)

FOREIGN PATENT DOCUMENTS

| | | |
|---|---|---|
| CN | 102431950 | 5/2012 |
| CN | 103221333 | 7/2013 |

OTHER PUBLICATIONS

Burns et al, "Low Profile Packaging for MEMS Aero-Acoustic Sensors", Department of Mechanical Engineering, Tufts University, 200College Avel, Medford MA 02155, MRS Online Proceeding Library, Jan. 2012, 1415, DOI: 10.1557/opl.2012.48, pp. 1-7.

(Continued)

*Primary Examiner* — Whitney T Moore
(74) *Attorney, Agent, or Firm* — Allen, Dyer, Doppelt, Milbrath & Gilchrist, P.A.

(57) ABSTRACT

An electronic device may include first and second laterally spaced apart interconnect substrates defining a slotted opening, and a first IC in the slotted opening and electrically coupled to one or more of the first and second interconnect substrates. The electronic device may include a first other IC over the first IC and electrically coupled to one or more of the first and second interconnect substrates, and encapsulation material over the first and second interconnect substrates, the first IC, and the first other IC.

21 Claims, 4 Drawing Sheets

(56) References Cited

U.S. PATENT DOCUMENTS

| | | |
|---|---|---|
| 2006/0284299 A1 | 12/2006 | Karnezos |
| 2012/0112368 A1* | 5/2012 | Gorai .................. B81C 1/0023 257/782 |
| 2013/0050227 A1 | 2/2013 | Petersen |
| 2013/0256896 A1 | 10/2013 | Xue |

OTHER PUBLICATIONS

Lengignon et al, "Ultra Low Profile Silicon Capacitors (Down to 80 μm) Applied to Decoupling Applications. Results on ESR/ESL", IPDIA White Paper SI Caps for Decoupling Applications, Oct. 14, 2013, pp. 1-6.

* cited by examiner

COMPACT ELECTRONIC PACKAGE WITH MEMS IC AND RELATED METHODS

TECHNICAL FIELD

The present disclosure relates to the field of electronic devices, and, more particularly, to integrated circuits and related methods.

BACKGROUND

In electronic devices with integrated circuits (ICs), the ICs are typically mounted onto circuit boards. In order to electrically couple connections between the circuit board and the IC, the IC is typically "packaged." The IC packaging usually provides a small encasement for physically protecting the IC and provides contact pads for coupling to the circuit board. In some applications, the packaged IC may be coupled to the circuit board via bond wires or solder bumps.

One particular type of IC that has become quite prevalent is the microelectromechanical systems (MEMS) IC. These MEMS ICs are manufactured using the same techniques used in typical IC manufacture. Some typical MEMS ICs include gyroscopes and accelerometers. Indeed, gyroscopes and accelerometers are now included in most mobile cellular devices and utilized by many software applications thereon.

Referring to FIG. 1, a typical packaged MEMS electronic device 80 is now described. The electronic device 80 includes a substrate 82 comprising a plurality of contacts 93a-93b, a first adhesive layer 84 on the substrate, a first IC 81 on the first adhesive layer, a second adhesive layer 88 on the first IC, a first MEMS IC 85 on the second adhesive layer, a third adhesive layer 95 on the first MEMS IC, a second MEMS IC 86 on the third adhesive layer, a fourth adhesive layer 89 on the second MEMS IC, and a second IC 91 on the fourth adhesive layer. The electronic device also includes a plurality of bond wires 92a-92e coupled between the substrate 82 and the first and second ICs/MEMS ICs 81, 85, 86, 91, and encapsulation material 94 over the substrate and the first and second ICs/MEMS ICs.

SUMMARY

An electronic device may include first and second laterally spaced apart interconnect substrates defining a slotted opening therebetween, at least one first IC in the slotted opening and electrically coupled to at least one of the first and second interconnect substrates, and at least one first other IC over the at least one first IC and electrically coupled to at least one of the first and second interconnect substrates. The electronic device may include encapsulation material over the first and second interconnect substrates, the at least one first IC, and the at least one first other IC. Advantageously, the electronic device may provide a thinner low profile IC package.

In some embodiments, the electronic device may further comprise a third interconnect substrate over the first interconnect substrate and laterally adjacent the at least one first other IC. The third interconnect substrate may be aligned with the at least one first other IC. The electronic device may further comprise a plurality of solder bodies between the first and third interconnect substrates. The third interconnect substrate may comprise a dielectric layer, and electrically conductive traces extending therethrough and coupled to the first interconnect substrate and the at least one first IC.

Additionally, the electronic device may further comprise at least one bond wire between the at least one first IC and at least one of the first and second interconnect substrates. In some embodiments, the at least one first other IC may comprise at least one first MEMS IC, and the electronic device may further comprise at least one second MEMS IC over the at least one first MEMS IC. The electronic device may further comprise at least one second IC over the at least one first other IC and electrically coupled to at least one of the first and second interconnect substrates.

Also, the electronic device may further comprise an adhesive layer between the at least one first IC and the at least one first other IC. The at least one first IC may define respective open spaces at opposing sides of the slotted opening, and the encapsulation material may fill the respective open spaces. The at least one first other IC may comprise at least one of a gyroscope and an accelerometer.

Another aspect is directed to a method for making an electronic device. The method may include positioning first and second interconnect substrates to be laterally spaced apart and defining a slotted opening therebetween, and positioning at least one first IC in the slotted opening and electrically coupled to at least one of the first and second interconnect substrates. The method may also include positioning at least one first other IC over the at least one first IC and electrically coupled to at least one of the first and second interconnect substrates, and forming encapsulation material over the first and second interconnect substrates, the at least one first IC, and the at least one first other IC.

DETAILED DESCRIPTION

The present embodiments will now be described more fully hereinafter with reference to the accompanying drawings, in which preferred embodiments are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout, and prime notation is used to indicate similar elements in alternative embodiments.

Figure 2:
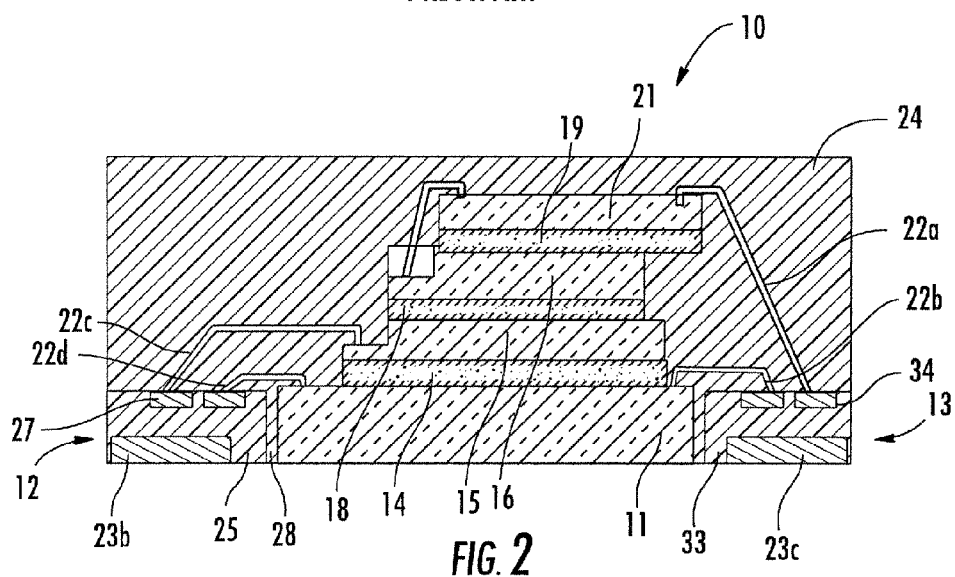
FIG. 2 is a schematic diagram of a cross sectional view of an electronic device, according to the present disclosure.
Figure 3:
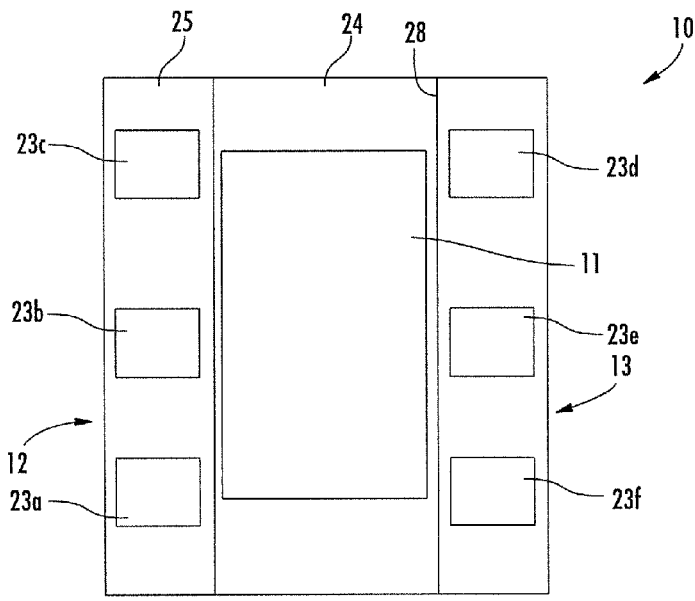
FIG. 3 is a bottom plan view of the electronic device of FIG. 2.

Referring now to FIGS. 2-3, an electronic device 10 according to the present disclosure is now described. The electronic device 10 illustratively includes first and second 12-13 laterally spaced apart interconnect substrates defining a slotted opening 28 therebetween. In the illustrated embodiment, the slotted opening 28 is rectangular in shape, but may take on other shapes, such as a trapezoid or square, for example, in other embodiments. The first interconnect substrate 12 illustratively includes a substrate 25, and electrically conductive traces 27 extending therethrough. Similarly, the second interconnect substrate 13 illustratively includes a substrate 33, and electrically conductive traces 34 extending therethrough. Moreover, as perhaps best seen in FIG. 3, the electrically conductive traces 27, 34 of the first and second interconnect substrates 12-13 define a plurality of electrically conductive contacts 23a-23f on a bottom surface of the electronic device 10. In the illustrated embodiment, the plurality of electrically conductive contacts 23a-23f comprises land grid array contacts, but other contact types may be used (e.g. ball or pin grid array contacts).

The electronic device 10 illustratively includes a first IC 11 in the slotted opening 28 and electrically coupled to the first and second interconnect substrates 12-13. In other words, the first IC 11 is recessed below an upper surface of the first and second interconnect substrates 12-13. The first IC 11 illustratively defines respective open spaces at opposing sides of the slotted opening 28. The electronic device 10 illustratively includes a first other IC (illustratively a MEMS IC, i.e. a first MEMS IC) 15 over the first IC 11 and electrically coupled to the first interconnect substrate 12. The electronic device illustratively includes a second other IC (illustratively a MEMS IC, i.e. a second MEMS IC) 16 over the first MEMS IC 15. For example, the first and second MEMS ICs 15-16 may each comprise at least one of a gyroscope and an accelerometer. The electronic device illustratively includes a second IC 21 over the first and second MEMS ICs 15-16 and electrically coupled to the second interconnect substrate 13 and the second MEMS IC 16. The first and second MEMS ICs 15, 16 may comprise, for example: (1) a sensor die made using micromachining technology to be integrated with an IC die; and (2) a single same die micro machined sensor and electronics IC integrated together.

While the electronic device 10 illustratively comprises first and second MEMS ICs 15, 16, other ICs types may be used. Furthermore, the present disclosure may be applied to other applications/products that need a low profile package with high integration and need further thinning of dice, such as a MEMS IC.

The electronic device 10 illustratively includes a first adhesive layer 14 between the first IC 11 and the first MEMS IC 15, a second adhesive layer 18 between the first MEMS IC and the second MEMS IC 16, and a third adhesive layer 19 between the second MEMS IC and the second IC 21. For example, the first, second, and third adhesive layers 14, 18, 19 may each comprises die attach film (DAF).

The electronic device 10 illustratively includes encapsulation material 24 over the first and second interconnect substrates 12-13, the first and second ICs 11, 21, and the first and second MEMS ICs 15-16, and filling the respective open spaces in the slotted opening 28. For example, the encapsulation material 24 may comprise a molding compound. Additionally, the electronic device 10 illustratively includes a plurality of bond wires 22a-22d between the first and second ICs/MEMS ICs 11, 21, 15-16, and one of more of the first and second interconnect substrates 12-13. Also, the plurality of bond wires 22a-22d also extends between the second IC 21 and the second MEMS IC 16.

The electrically conductive bond wires 22a-22d, traces 27, 34, and contacts 23a-23f may comprise copper or aluminum, for example. The substrates 25, 33 may comprise an organic material, such as liquid crystal polymer, or a silicon based material. In some embodiments, the first and second ICs 11, 21 may comprise application specific ICs (ASICs).

Another aspect is directed to a method for making an electronic device 10. The method may include positioning first and second interconnect substrates 12-13 to be laterally spaced apart and defining a slotted opening 28 therebetween, and positioning at least one first IC 11 in the slotted opening and electrically coupled to at least one of the first and second interconnect substrates. The method may also include positioning at least one first MEMS IC 15 over the at least one first IC 11 and electrically coupled to at least one of the first and second interconnect substrates 12-13, and forming encapsulation material 24 over the first and second interconnect substrates, the at least one first IC, and the at least one first MEMS IC.

In some embodiments, the electronic device 10 may be included in a mobile wireless communications device, such as a cellular phone. The mobile wireless communications device may include a housing, a processor carried by the housing, and the electronic device 10 carried by the housing and coupled to the processor.

Figure 1:
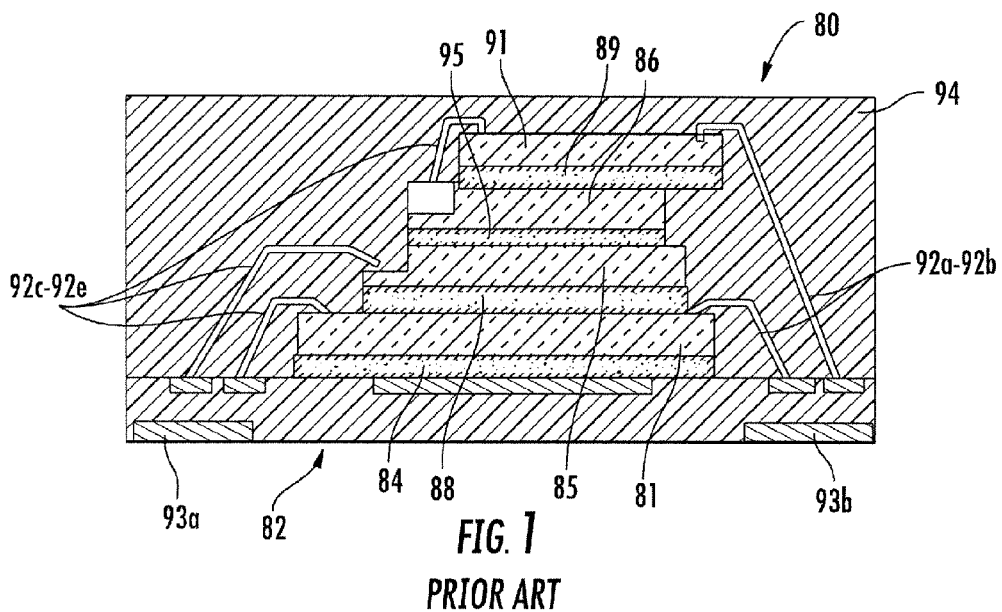
FIG. 1 is a schematic diagram of a cross sectional view of an electronic device, according to the prior art.

Advantageously, the electronic device 10 may provide several benefits over the prior art electronic device 80 of FIG. 1. In particular, the electronic device 10 provides a low profile package that is 17% thinner than the prior art electronic device 80. Also, the electronic device 10 may readily incorporate more ICs into its design. This low profile feature is quite helpful for cellular applications, where several MEMS ICs are used and where low profile designs are highly valued. Also, the electronic device 10 is flexible, which reduces damage during high speed assembly of devices including the electronic device 10.

Figure 4:
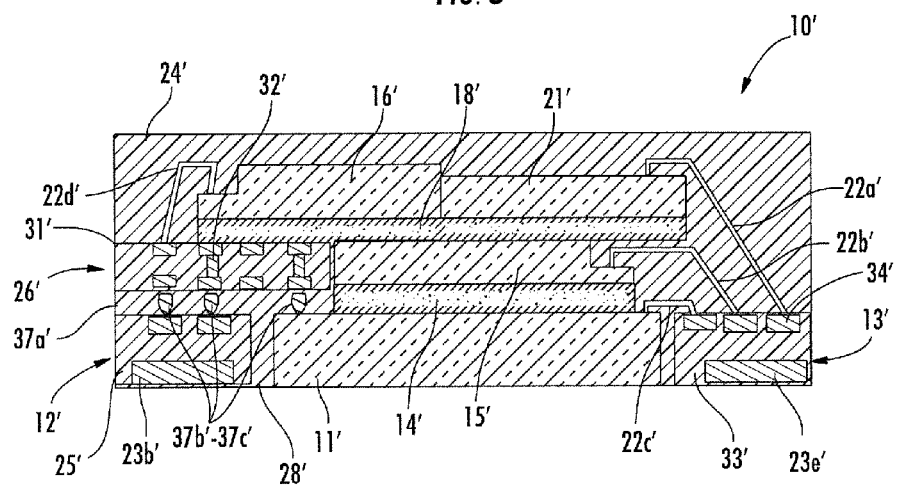
FIG. 4 is a schematic diagram of a cross sectional view of another embodiment of the electronic device, according to the present disclosure.
Figure 5A:
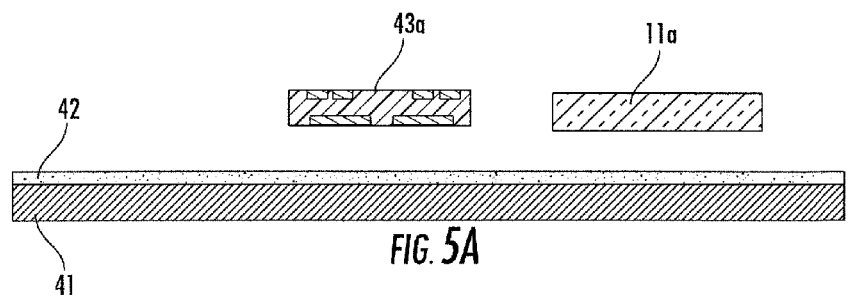
FIGS. 5A-5D are schematic diagrams of cross sectional views of steps in a method for making the electronic device of FIG. 2.
Figure 5B:
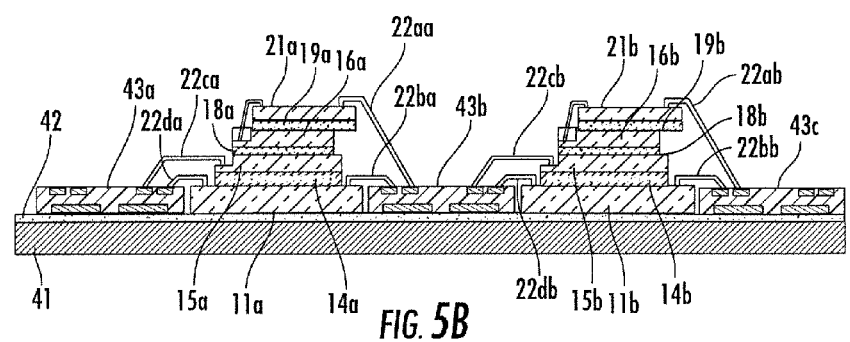
Figure 5C:
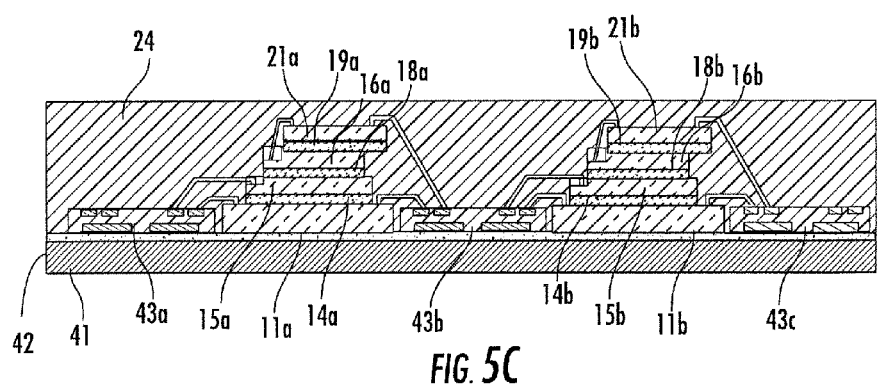
Figure 5D:
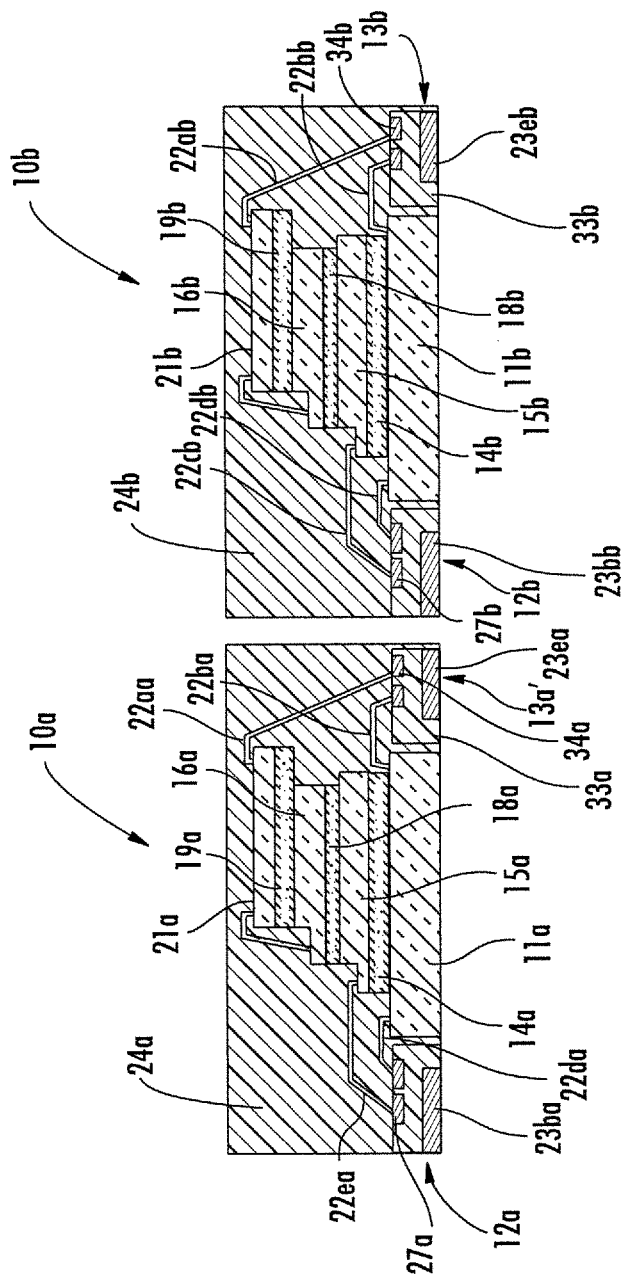

Referring now additionally to FIG. 4, another embodiment of the electronic device 10' is now described. In this embodiment of the electronic device 10', those elements already discussed above with respect to FIGS. 2-3 are given prime notation and most require no further discussion herein. This embodiment differs from the previous embodiment in that this electronic device 10' illustratively includes a third interconnect substrate 26' over the first interconnect substrate 12' and laterally adjacent the first MEMS IC 15'. In particular, the third interconnect substrate 26' is illustratively aligned with the first MEMS IC 15'. The electronic device 10' illustratively includes a plurality of solder bodies 37a'-37c' between the first 12' and third 26' interconnect substrates. The third interconnect substrate 26' illustratively includes a dielectric layer 31', and electrically conductive traces 32' extending therethrough and coupled to the first interconnect substrate 12' and the first IC 11'.

In this embodiment, the second IC 21' and the second MEMS IC 16' are positioned horizontally adjacent and aligned with each other. Advantageously, this electronic device 10' is thinner than the embodiment of FIGS. 2-3, providing a 25% reduction in thickness over the prior art electronic device 80.

Referring now additionally to FIGS. 5A-5D, a method for making the electronic device 10 of FIG. 2 is now described. In the illustrated embodiment, the method manufactures first and second electronic devices 10a, 10b (FIG. 5D), but it should be appreciated that via wafer level processing techniques, the method can be expanded for simultaneous manufacture of a large number of devices (i.e. much greater than the illustrated two). The method illustratively includes positioning IC stacks onto a carrier layer 41, and associated adhesive layer 42. The IC stacks include sequentially: the first IC 11a-11b, the first MEMS IC 15a-15b, the second MEMS IC 16a-16b, and the second IC 21a-21b. The method includes positioning substrates 43a-43c between the IC stacks and at the peripheral sides thereof. The method also includes forming the plurality of bond wires for the connections between the ICs 11a-11b, 15a-15b, 16a-16b, 21a-21b and the substrates 43a-43c.

The method includes forming the encapsulation material 24 to surround the IC stacks and the substrates 43a-43c. The method includes removal of the carrier layer 41 and the adhesive layer 42. The release of the carrier layer 41 may be accomplished by dissolving the adhesive layer 42, for example.

The method also includes a singulation step, for example using a blade or chemical etching. The singulation step splits the first and second electronic devices 10a-10b. In particular, the substrates 43a-43c are split to define the first and second interconnect substrates 12a-12b, 13a-13b.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

That which is claimed is:

1. An electronic device comprising:
   first and second laterally spaced apart interconnect substrates defining a slotted opening therebetween;
   at least one first integrated circuit (IC) in the slotted opening and electrically coupled to at least one of said first and second interconnect substrates;
   at least one first other IC over said at least one first IC and electrically coupled to at least one of said first and second interconnect substrates;
   said at least one first IC being offset with said at least one first other IC;
   an adhesive layer between said at least one first IC and said at least one first other IC;
   encapsulation material over said first and second interconnect substrates, said at least one first IC, and said at least one first other IC; and
   at least one bond wire directly coupled between said at least one first IC and said at least one of said first and second interconnect substrates.

2. The electronic device of claim 1 further comprising a third interconnect substrate over said first interconnect substrate and laterally adjacent said at least one first other IC.

3. The electronic device of claim 2 wherein said third interconnect substrate is aligned with said at least one first other IC.

4. The electronic device of claim 2 further comprising a plurality of solder bodies between said first and third interconnect substrates.

5. The electronic device of claim 2 wherein said third interconnect substrate comprises a dielectric layer, and electrically conductive traces extending therethrough and coupled to said first interconnect substrate and said at least one first IC.

6. The electronic device of claim 1 wherein said at least one first other IC comprises at least one first microelectromechanical systems (MEMS) IC; and further comprising at least one second MEMS IC over said at least one first MEMS IC.

7. The electronic device of claim 6 further comprising at least one second IC over said at least one first MEMS IC and electrically coupled to at least one of said first and second interconnect substrates.

8. The electronic device of claim 1 wherein said at least one first IC defines respective open spaces at opposing sides of the slotted opening; and wherein said encapsulation material fills the respective open spaces.

9. The electronic device of claim 1 wherein said at least one first other IC comprises at least one of a gyroscope and an accelerometer.

10. An electronic device comprising:
    first and second laterally spaced apart interconnect substrates defining a slotted opening therebetween;
    at least one first integrated circuit (IC) in the slotted opening defining respective open spaces at opposing sides of the slotted opening and electrically coupled to at least one of said first and second interconnect substrates;
    at least one first microelectromechanical systems (MEMS) IC over said at least one first IC and electrically coupled to at least one of said first and second interconnect substrates;
    said at least one first IC being offset with said at least one first MEMS IC;
    an adhesive layer between said at least one first IC and said at least one first MEMS IC;
    encapsulation material over said first and second interconnect substrates, said at least one first IC, and said at least one first MEMS IC and filling the respective open spaces; and
    at least one bond wire directly coupled between said at least one first IC and said at least one of said first and second interconnect substrates.

11. The electronic device of claim 10 further comprising a third interconnect substrate over said first interconnect substrate and laterally adjacent said at least one first MEMS IC.

12. The electronic device of claim 11 wherein said third interconnect substrate is aligned with said at least one first MEMS IC.

13. The electronic device of claim 11 further comprising a plurality of solder bodies between said first and third interconnect substrates.

14. The electronic device of claim 11 wherein said third interconnect substrate comprises a dielectric layer, and electrically conductive traces extending therethrough and coupled to said first interconnect substrate and said at least one first IC.

15. A method for making an electronic device comprising:
    positioning first and second interconnect substrates to be laterally spaced apart and defining a slotted opening therebetween;
    positioning at least one first integrated circuit (IC) in the slotted opening and electrically coupled to at least one of the first and second interconnect substrates;
    positioning at least one first other IC over the at least one first IC and electrically coupled to at least one of the first and second interconnect substrates, the at least one first IC being offset with the at least one first other IC;
    forming an adhesive layer between the at least one first IC and the at least one first other IC;
    forming encapsulation material over the first and second interconnect substrates, the at least one first IC, and the at least one first other IC; and
    forming at least one bond wire directly coupled between the at least one first IC and the at least one of the first and second interconnect substrates.

16. The method of claim 15 further comprising positioning a third interconnect substrate over the first interconnect substrate and laterally adjacent the at least one first other IC.

17. The method of claim 16 further comprising aligning the third interconnect substrate with the at least one first other IC.

18. The method of claim 16 further comprising forming a plurality of solder bodies between the first and third interconnect substrates.

19. The method of claim 16 wherein the third interconnect substrate comprises a dielectric layer, and electrically conductive traces extending therethrough and coupled to the first interconnect substrate and the at least one first IC.

20. The method of claim 15 wherein the at least one other IC comprises at least one first microelectromechanical systems (MEMS) IC; and further comprising positioning at least one second MEMS IC over the at least one first MEMS IC.

21. The method of claim 20 further comprising positioning at least one second IC over the at least one first MEMS IC and electrically coupled to at least one of the first and second interconnect substrates.

* * * * *